(12) United States Patent
Tsai et al.

(10) Patent No.: US 11,764,162 B2
(45) Date of Patent: Sep. 19, 2023

(54) ELECTRONIC PACKAGE AND METHOD FOR MANUFACTURING THE SAME

(71) Applicant: SILICONWARE PRECISION INDUSTRIES CO., LTD., Taichung (TW)

(72) Inventors: Ming-Fan Tsai, Taichung (TW); Chih-Wei Chen, Taichung (TW); Tsung-Hsien Tsai, Taichung (TW); Chao-Ya Yang, Taichung (TW); Chia-Yang Chen, Taichung (TW)

(73) Assignee: SILICONWARE PRECISION INDUSTRIES CO., LTD., Taichung (TW)

( * ) Notice: Subject to any disclaimer, the term of this patent is extended or adjusted under 35 U.S.C. 154(b) by 0 days.

(21) Appl. No.: 16/997,173

(22) Filed: Aug. 19, 2020

(65) Prior Publication Data
US 2021/0210435 A1    Jul. 8, 2021

(30) Foreign Application Priority Data
Jan. 6, 2020    (TW) .................................. 109100324

(51) Int. Cl.
*H01L 23/552*    (2006.01)
*H01L 23/00*    (2006.01)
*H01L 23/31*    (2006.01)
*H01L 21/48*    (2006.01)
*H01L 21/56*    (2006.01)
*H01L 23/498*    (2006.01)

(52) U.S. Cl.
CPC ........ *H01L 23/552* (2013.01); *H01L 21/4853* (2013.01); *H01L 21/565* (2013.01); *H01L 23/3121* (2013.01); *H01L 23/49838* (2013.01); *H01L 24/48* (2013.01); *H01L 2224/48227* (2013.01); *H01L 2924/3025* (2013.01)

(58) Field of Classification Search
CPC .................................................... H01L 23/552
See application file for complete search history.

(56) References Cited

U.S. PATENT DOCUMENTS

| | | | |
|---|---|---|---|
| 7,898,066 B1* | 3/2011 | Scanlan | H01L 24/97 257/659 |
| 2019/0051616 A1* | 2/2019 | Jeon | H01L 24/49 |

* cited by examiner

*Primary Examiner* — Yu-Hsi D Sun
(74) *Attorney, Agent, or Firm* — Kelly & Kelley, LLP

(57) ABSTRACT

An electronic package and a manufacturing method thereof are provided, where a plurality of shielding wires are arranged on a carrier and spanning across an electronic component to cover the electronic component, so that the shielding wires serve as a shielding structure to protect the electronic component from the interference of external electromagnetic waves.

18 Claims, 4 Drawing Sheets

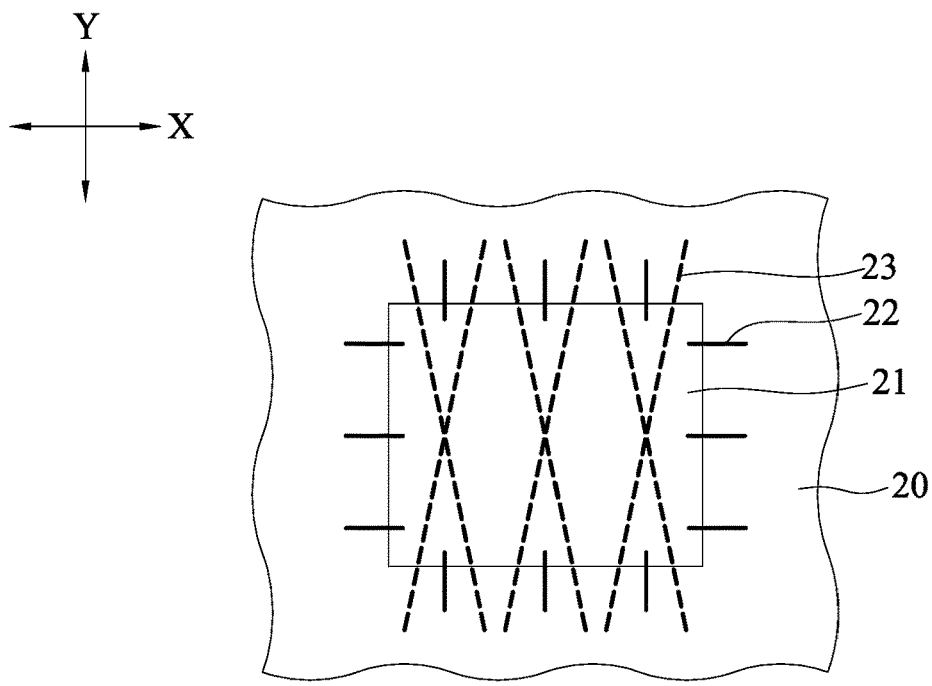
FIG. 2B'
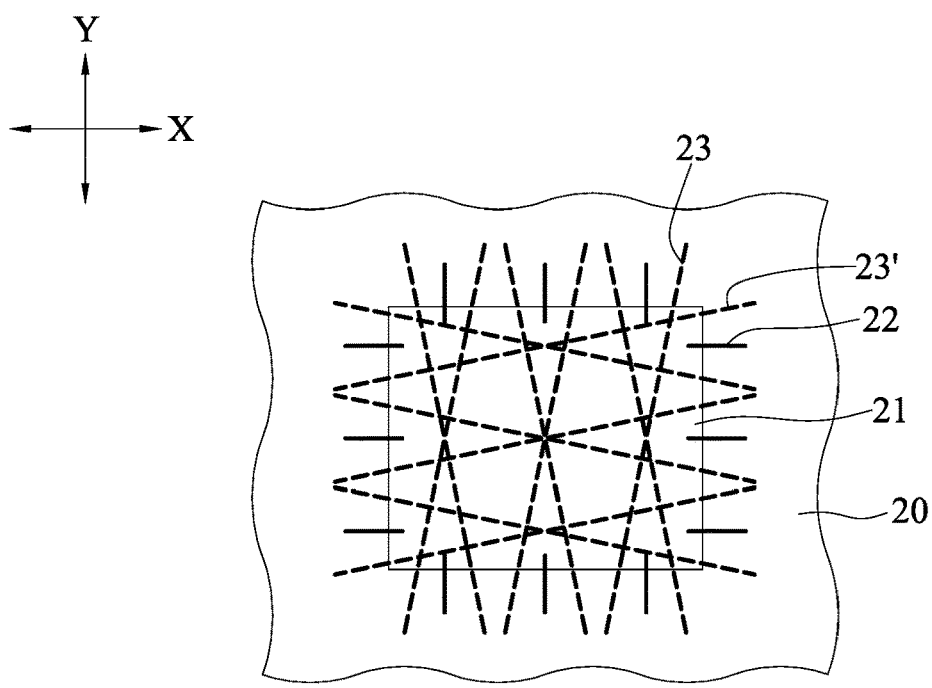
FIG. 2B"

ELECTRONIC PACKAGE AND METHOD FOR MANUFACTURING THE SAME

BACKGROUND

1. Technical Field

The present disclosure relates to a semiconductor packaging process, and more particularly, to an electronic package including a shielding structure and a method for manufacturing the same.

2. Description of Related Art

With the rapid development of the electronic industry, most electronic products are becoming more compact and have higher speeds. More particularly, the development of the communication industry has allowed communication devices to be widely used in all kinds of electronic products, such as cell phones, laptops and the like. These electronic products require the use of high-frequency RF (radio-frequency) chips. However, the RF chips may be provided in close proximity to digital integrated chips, digital signal processors (DSPs), base band (BB) chips or the like, in which the issue of electromagnetic interference (EMI) arises. As a result, electromagnetic shielding needs to be provided.

In a method for manufacturing a conventional RF module 1 that reduces EMI, as shown in FIGS. 1A to 1C, a plurality of RF chips 11a, 11b and a non-RF electronic component 11 are electrically connected on a package substrate 10, and then the RF chips 11a, 11b and the non-RF electronic component 11 are encapsulated by an encapsulating layer 13 (e.g., epoxy resin), and a metal thin film 14 is then formed on the encapsulating layer 13. The RF chips 11a, 11b, the non-RF electronic component 11 and the package substrate 10 of the RF module 1 are protected by the encapsulating layer 13 from the intrusions of external moisture or pollutants, and the RF chips 11a, 11b are protected from the external EMI by the metal thin film 14.

Despite that the EMI can be blocked in some circumstances by applying the metal thin film 14 on the periphery of the conventional RF module 1, in the case that the RF chips 11a, 11b are low-frequency components, it may be challenging to reduce the EMI if only a single layer of metal thin film 14 is used as the shielding layer.

Therefore, there is a need for a solution that addresses the aforementioned issues in the prior art.

SUMMARY

In view of the aforementioned shortcomings of the prior art, the present disclosure provides an electronic package, which may include: a carrier; an electronic component disposed on the carrier and electrically connected to the carrier; a plurality of shielding wires disposed on the carrier and spanning across the electronic component, wherein the plurality of shielding wires crisscross one another; and an encapsulating layer formed on the carrier to encapsulate the electronic component and the shielding wires.

The present disclosure further provides a method for manufacturing an electronic package, which may include: providing a carrier having at least one electronic component disposed thereon, the electronic component being electrically connected to the carrier; forming on the carrier a plurality of shielding wires spanning across the electronic component to cover the electronic component, wherein the plurality of shielding wires crisscross one another; and forming an encapsulating layer on the carrier to encapsulate the electronic component and the shielding wires.

In the aforementioned electronic package and the method for manufacturing the electronic package, two opposite ends of each of the shielding wires are respectively connected to the carrier.

In the aforementioned electronic package and the method for manufacturing the electronic package, the shielding wires are bonding wires for wiring bonding.

In the aforementioned electronic package and the method for manufacturing the electronic package, the plurality of shielding wires are arranged along one direction with respect to the electronic component.

In the aforementioned electronic package and the method for manufacturing the electronic package, the plurality of shielding wires are arranged along multiple directions with respect to the electronic component.

In the aforementioned electronic package and the method for manufacturing the electronic package, the shielding wires are partially exposed from the encapsulating layer.

In the aforementioned electronic package and the method for manufacturing the electronic package, the shielding wires are curved wires with arc tops exposed from the encapsulating layer. For example, the arc tops are flush with a surface of the encapsulating layer.

The aforementioned electronic package and the method for manufacturing the electronic package may further include a shielding member formed on the encapsulating layer.

As can be understood from the above, in the electronic package and the method for manufacturing the same in accordance with the present disclosure, the shielding wires spanning across the electronic component serve as shielding structures to protect the electronic component from external electromagnetic interference (EMI). Moreover, irregular paths formed by the crisscrossing shielding wires disturb the radiation paths, so that smaller amounts of electromagnetic radiations can be obtained, and shielding against EMI can thus be improved.

Moreover, if the electronic component is a low-frequency component, the shielding wires embedded in the encapsulating layer are capable of providing better EMI shielding.

BRIEF DESCRIPTION OF THE DRAWINGS

FIGS. 2B' and 2B" are schematic partial top views of the different perspectives of FIG. 2B.

DETAILED DESCRIPTION

Figure 1A:
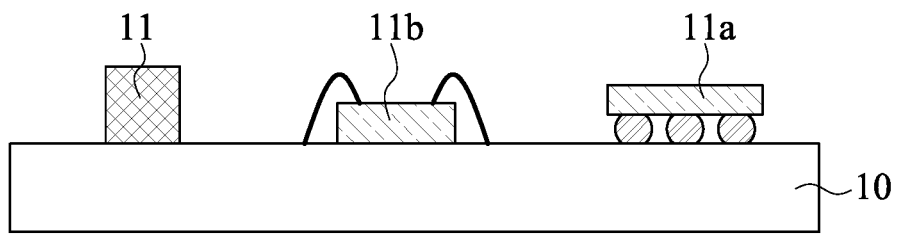
FIGS. 1A to 1C are schematic cross-sectional diagrams illustrating a method for manufacturing a conventional RF module.
Figure 1B:
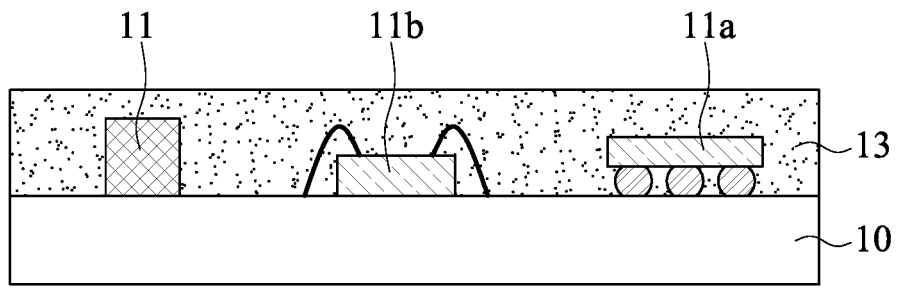
Figure 1C:
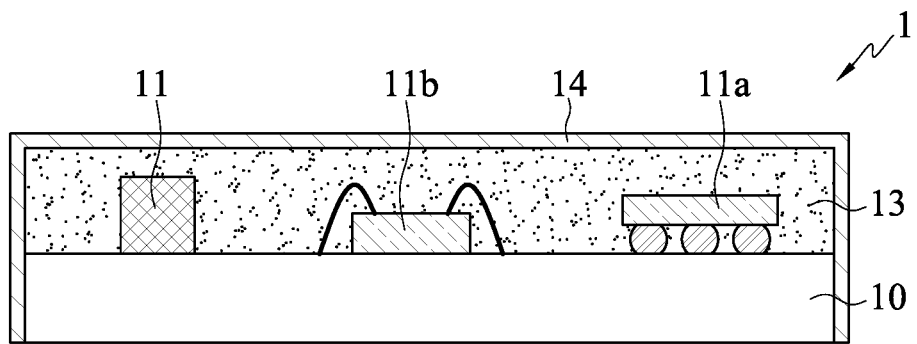

The implementations of present disclosure are illustrated using the following embodiments. One of ordinary skill in the art can readily appreciate other advantages and technical effects of the present disclosure upon reading the disclosure of this specification.

It should be noted that the structures, ratios, sizes shown in the drawings appended to this specification are to be construed in conjunction with the disclosure of this specification in order to facilitate understanding of those skilled in the art. They are not meant, in any ways, to limit the implementations of the present disclosure, and therefore have no substantial technical meaning. Without affecting the effects created and the objectives achieved by the present disclosure, any modifications, changes or adjustments to the structures, ratio relationships or sizes, are to be construed as falling within the range covered by the technical contents disclosed herein. Meanwhile, terms such as "first," "second," "above," "a," "an," and the like, are for illustrative purposes, and are not meant to limit the scope in which the present disclosure can be implemented. Any variations or modifications made to their relative relationships, without changing the substantial technical content, are also to be considered as within the scope in which the present disclosure can be implemented.

FIGS. 2A to 2E are schematic cross-sectional diagrams illustrating a method for manufacturing an electronic package 2 in accordance with the present disclosure.

Figure 2A:
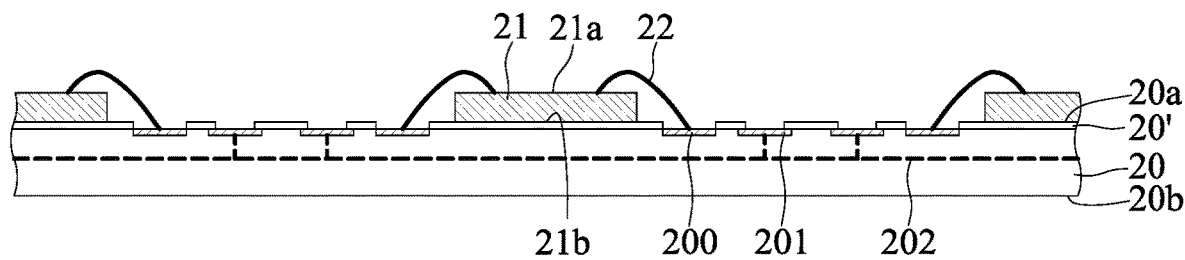
FIGS. 2A to 2E are schematic cross-sectional diagrams illustrating a method for manufacturing an electronic package in accordance with the present disclosure.

As shown in FIG. 2A, a carrier 20 and at least one electronic component 21 are provided. The carrier 20 includes a first side 20a and a second side 20b opposite to each other. The electronic component 21 is disposed on the first side 20a and electrically connected to the carrier 20.

In an embodiment, the carrier 20 is, for example, a substrate including a core layer and a circuit structure or a coreless circuit structure. The circuit structure including circuit layers (not shown) formed on a dielectric material, such as, for example, a fan-out redistribution layer (RDL), and the dielectric material can be a polybenzoxazole (PBO), polyimide (PI), a prepreg (PP), or the like. As an example, a circuit layer and an insulating protective layer 20' are provided at an outermost side of the substrate. The circuit layer includes a plurality of electrical contact pads 200 and ground pads 201 exposed from the insulating protective layer 20', and the ground pads 201 are electrically connected to a ground layer 202 of internal circuit of the substrate. It can be appreciated that the carrier 20 can also be other carrier units for carrying electronic components (e.g., chips), such as a lead frame, a silicon interposer, or the like, and the present disclosure is not limited as such.

In addition, the electronic component 21 is an active component, a passive component or a combination of the above, and the active component is, for example, a semiconductor chip, and the passive component is, for example, a resistor, a capacitor or an inductor. The electronic component 21 is a RF chip or other semiconductor chips, such as a Bluetooth chip or a Wi-Fi (Wireless Fidelity) chip. The electronic component 21 includes an active face 21a and a non-active face 21b opposite to each other with a plurality of electrode pads (not shown) are provided on the active face 21a and with the non-active face 21b disposing on the first side 20a of the carrier 20, such that the electronic component 21 is electrically connected with the circuit layer of the carrier 20 via the electrode pads and a plurality of bonding wires 22 by wire bonding. Alternatively, the electronic component 21 is electrically connected with the circuit layer using its electrode pads and a plurality of conductive bumps (not shown) in a flip-chip manner. Alternatively, the electronic component 21 is directly in contact with the circuit layer to electrically connected with it. However, the way in which the electronic component 21 is electrically connected with the carrier 20 is not limited to those described above.

Figure 2B:
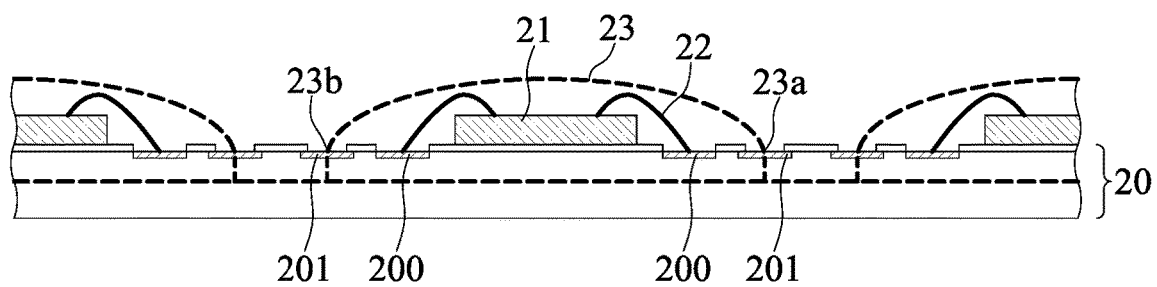

A shown in FIG. 2B, a plurality of shielding wires 23 spanning across the electronic component 21 are formed on the first side 20a of the carrier 20, such that the active face 21a of the electronic component 21 is covered by the shielding wires 23.

In an embodiment, the two opposite ends 23a, 23b of the shielding wires 23 are respectively connected to the ground pads 201. For example, two shielding wires 23 intersect each other at a single point, as shown in FIG. 2B'.

Furthermore, the shielding wires 23 are bonding wires formed by wire bonding, such as curved gold wires. A plurality of shielding wires 23 can be disposed along one direction (e.g., X or Y direction) over a single electronic component 21, such as that shown in FIG. 2B'. Alternatively, a plurality of shielding wires 23, 23' can be disposed along multiple directions (e.g., X and Y directions) over a single electronic component 21, such as that shown in FIG. 2B".

Figure 2C:
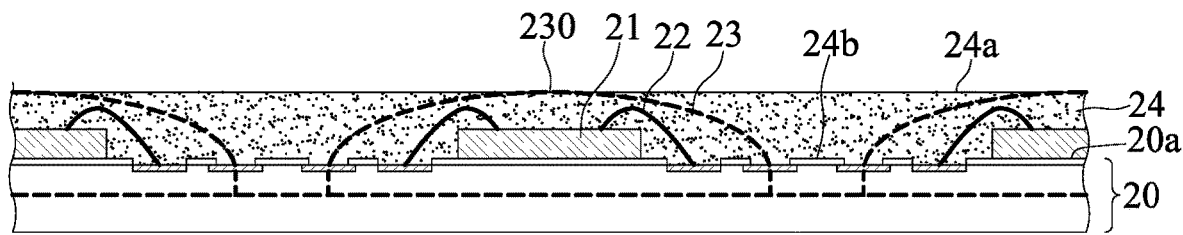

As shown in FIG. 2C, an encapsulating layer 24 is formed on the first side 20a of the carrier 20, such that the encapsulating layer 24 encapsulates the electronic component 21, the bonding wires 22 and the shielding wires 23.

In an embodiment, the encapsulating layer 24 is an insulating material, such as polyimide (PI), a dry film, a molding compound (e.g., epoxy resin), etc. For example, the encapsulating layer 24 can be formed on the carrier 20 by liquid compound molding, injection, lamination, compression molding, etc.

In addition, the encapsulating layer 24 includes a first surface 24a and a second surface 24b opposite to each other, and the encapsulating layer 24 is bonded onto the first side 20a of the carrier 20 via its second surface 24b. At least a portion of the surfaces of the shielding wires 23 are exposed from the first surface 24a of the encapsulating layer 24. For example, using a leveling process, the first surface 24a of the encapsulating layer 24 is made to be flush with the arc tops 230 of the shielding wires 23, such that the arc tops 230 of the shielding wires 23 are exposed from the first surface 24a of the encapsulating layer 24. More specifically, the leveling process includes removing a portion of the encapsulating layer 24 by polishing. It can be appreciated that there are numerous methods for exposing the shielding wires 23, such as drilling, and the present disclosure is not limited as such.

Figure 2D:
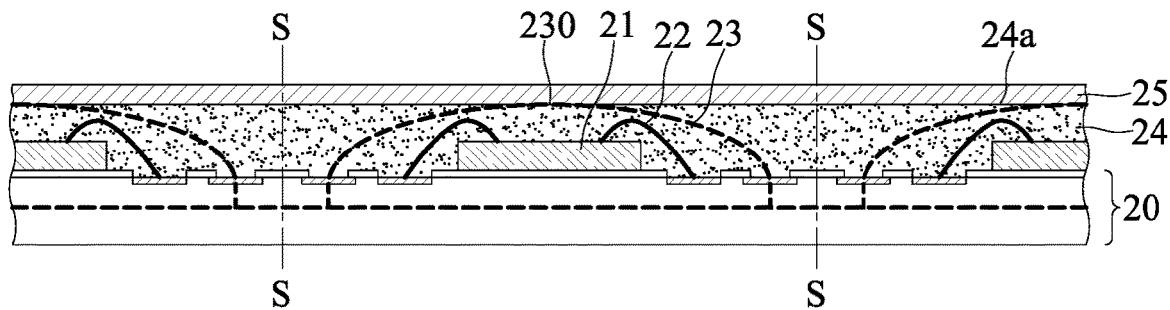

As shown in FIG. 2D, a shielding member 25 is formed on the first surface 24a of the encapsulating layer 24, and the shielding member 25 is in contact with the shielding wires 23.

In an embodiment, the shielding member 25 is a conductive material that is different from the material of the encapsulating layer 24. For example, the shielding member 25 is a conductive layer, such as copper (Cu), nickel (Ni), iron (Fe), aluminum (Al), etc., and is formed by electroplating, chemical plating (e.g., sputtering), coating or other methods.

Figure 2E:
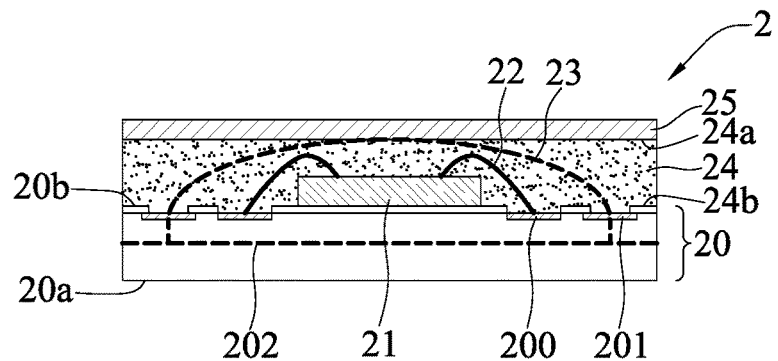

As shown in FIG. 2E, a plurality of electronic package 2 are obtained by performing a singulation process along cutting paths S shown in FIG. 2D, and a plurality of conductive components (e.g., solder balls) (not shown) can be formed on the second side 20b of the carrier 20 to allow the electronic package 2 to be connected with an electronic product (not shown), such as a circuit board.

In an embodiment, the electronic package 2 is a radio-frequency (RF) module that is capable of emitting electromagnetic waves.

Therefore, in the manufacturing method of the present disclosure, the shielding wires 23, 23' spanning across the electronic component 21 serve as shielding structures to protect the electronic component 21 from external electromagnetic interference (EMI). Moreover, irregular paths formed by the crisscrossing shielding wires 23, 23' disturb the radiation paths, so smaller amounts of electromagnetic radiations can be obtained, and shielding against EMI can thus be improved.

Moreover, if the electronic component 21 is a low-frequency component, the shielding wires 23, 23' can be buried into the encapsulating layer 24 to become closer to the electronic component 21, providing better EMI shielding.

The present disclosure also provides an electronic package 2, which includes a carrier 20, an electronic component 21 and a plurality of shielding wires 23.

The carrier 20 includes a plurality of ground pads 201.

The electronic component 21 is disposed on the carrier 20 and electrically connected to the carrier 20.

The shielding wires 23 are disposed on the carrier 20 and spanning across the electronic component 21 to cover the electronic component 21, wherein the plurality of shielding wires 23 crisscross one another.

The encapsulating layer 24 is formed on the carrier 20 to encapsulate the electronic component 21 and the shielding wires 23.

In an embodiment, two opposite ends 23a, 23b of the shielding wires 23 are respectively connected to ground pads 201 of the carrier 20.

In an embodiment, the shielding wires 23 are bonding wires used in wiring bonding.

In an embodiment, the plurality of shielding wires 23 are arranged along one direction with respect to the electronic component.

In an embodiment, the plurality of shielding wires 23, 23' are arranged along multiple directions with respect to the electronic component.

In an embodiment, the shielding wires 23 are exposed from the encapsulating layer 24.

In an embodiment, the shielding wires 23 are curved wires with arc tops 230 exposed from the encapsulating layer 24. For example, the arc tops 230 are flush with a first surface 24a of the encapsulating layer 24.

In an embodiment, the electronic package 2 further includes a shielding member 25 formed on the encapsulating layer 24.

In conclusion, in the electronic package and the method for manufacturing the same in accordance with the present disclosure, shielding wires are employed to protect the electronic component from external EMI.

The above embodiments are set forth to illustrate the principles of the present disclosure, and should not be interpreted as to limit the present disclosure in any way. The above embodiments can be modified by one of ordinary skill in the art without departing from the scope of the present disclosure as defined in the appended claims.

What is claimed is:

1. An electronic package, comprising:
    a carrier;
    an electronic component disposed on the carrier and electrically connected to the carrier, wherein the electronic component includes an active surface and a non-active surface opposing the active surface with a plurality of electrode pads provided on the active surface and with the non-active surface disposed on the carrier, wherein the active surface has two opposing first side lengths parallel to each other and two opposing second side lengths perpendicular to the first side lengths, wherein the first side lengths are parallel to a X direction, and the second side lengths are parallel to a Y direction;
    a plurality of shielding wires disposed on the carrier and spanning across the electronic component, wherein projections of in a direction perpendicular to the active surface two of the plurality of shielding wires are free from being parallel to the X direction and the Y direction such that the two shielding wires intersect each other at a single point over the electronic component; and
    an encapsulating layer formed on the carrier to encapsulate the electronic component and the shielding wires.

2. The electronic package of claim 1, wherein two opposite ends of each of the shielding wires are respectively connected to the carrier.

3. The electronic package of claim 1, wherein the shielding wires are bonding wires for wiring bonding.

4. The electronic package of claim 1, wherein the plurality of shielding wires are arranged along one direction with respect to the electronic component.

5. The electronic package of claim 1, wherein the plurality of shielding wires are arranged along multiple directions with respect to the electronic component.

6. The electronic package of claim 1, wherein the shielding wires are partially exposed from the encapsulating layer.

7. The electronic package of claim 1, wherein the shielding wires are curved wires with arc tops exposed from the encapsulating layer.

8. The electronic package of claim 7, wherein the arc tops are flush with a surface of the encapsulating layer.

9. The electronic package of claim 1, further comprising a shielding member formed on the encapsulating layer.

10. A method for manufacturing an electronic package, comprising:
    providing a carrier having at least one electronic component disposed thereon, the electronic component being electrically connected to the carrier, wherein the electronic component includes an active surface and a non-active surface opposing the active surface with a plurality of electrode pads provided on the active surface and with the non-active surface disposed on the carrier, wherein the active surface has two opposing first side lengths parallel to each other and two opposing second side lengths perpendicular to the first side lengths, wherein the first side lengths are parallel to a X direction, and the second side lengths are parallel to a Y direction;
    forming on the carrier a plurality of shielding wires spanning across the electronic component, wherein projections in a direction perpendicular to the active surface of two of the plurality of shielding wires are free from being parallel to the X direction and the Y direction such that the two shielding wires intersect each other at a single point over the electronic component; and
    forming an encapsulating layer on the carrier to encapsulate the electronic component and the shielding wires.

11. The method of claim 10, wherein two opposite ends of each of the shielding wires are respectively connected to the carrier.

12. The method of claim 10, wherein the shielding wires are bonding wires for wiring bonding.

13. The method of claim 10, wherein the plurality of shielding wires are arranged along one direction.

14. The method of claim 10, wherein the plurality of shielding wires are arranged along multiple directions.

15. The method of claim 10, wherein the shielding wires are partially exposed from the encapsulating layer.

16. The method of claim 10, wherein the shielding wires are curved wires with arc tops exposed from the encapsulating layer.

17. The method of claim 16, wherein the arc tops are flush with a surface of the encapsulating layer.

18. The method of claim 10, further comprising forming a shielding member on the encapsulating layer.

\* \* \* \* \*